United States Patent
Park et al.

(10) Patent No.: US 7,388,746 B2
(45) Date of Patent: Jun. 17, 2008

(54) HEATSINK ASSEMBLY

(75) Inventors: Hee-sung Park, Suwon-si (KR); Jae-young Chang, Seoul (KR); Jong-in Jo, Suwon-si (KR); Han-kook Choi, Suwon-si (KR); Jin-wook Yoon, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 112 days.

(21) Appl. No.: 11/519,072

(22) Filed: Sep. 12, 2006

(65) Prior Publication Data

US 2007/0070603 A1 Mar. 29, 2007

(30) Foreign Application Priority Data

Sep. 29, 2005 (KR) .................... 10-2005-0091196

(51) Int. Cl.
*H05K 7/20* (2006.01)
*H01L 23/34* (2006.01)

(52) U.S. Cl. ............... 361/699; 361/695; 361/702; 361/719; 165/80.4; 257/712; 257/713; 257/714

(58) Field of Classification Search ............ 361/689, 361/698–703, 707–710, 714–720; 165/80.3, 165/80.4, 80.5, 104.33, 185, 104.21, 104.25, 165/168, 179; 257/712–718, 625, 676, 706, 257/796; 29/890.03, 890.038, 890.04; 62/259.2; 174/15.1, 16.3, 252, 17 R
See application file for complete search history.

(56) References Cited

U.S. PATENT DOCUMENTS

| | | | |
|---|---|---|---|
| 6,317,326 B1 * | 11/2001 | Vogel et al. ............. | 361/704 |
| 6,466,443 B1 | 10/2002 | Chen | |
| 6,587,343 B2 * | 7/2003 | Novotny et al. ........... | 361/698 |
| 7,272,006 B2 * | 9/2007 | Mongia et al. ........... | 361/702 |
| 7,285,851 B1 * | 10/2007 | Cepeda-Rizo et al. ...... | 257/712 |
| 2007/0050980 A1 * | 3/2007 | Vetter .................... | 29/890.043 |

FOREIGN PATENT DOCUMENTS

| | | |
|---|---|---|
| JP | 2002-184920 | 6/2002 |
| KR | 2002-23388 | 3/2002 |
| KR | 2002-62454 | 7/2002 |
| KR | 2002-82293 | 10/2002 |
| KR | 2003-41653 | 5/2003 |
| KR | 2003-69666 | 8/2003 |

OTHER PUBLICATIONS

Office Action issued in Korean Patent Application No. 2005-91196 on Sep. 30, 2006.

* cited by examiner

*Primary Examiner*—Michael V Datskovskiy
(74) *Attorney, Agent, or Firm*—Stein, McEwen & Bui, LLP

(57) ABSTRACT

A heatsink assembly having a simple structure for coupling a heatsink and an electronic chip is provided with a heatsink which contacts an electronic chip mounted on a substrate and absorbs heat generated from the electronic chip; and a pressing member which is coupled to the substrate and comprises: a pressing cover for pressing the heatsink so that the heatsink can be secured to the electronic chip; and tension parts which extend from the pressing cover and exert a pressing force onto the pressing cover, when being coupled to the substrate.

12 Claims, 4 Drawing Sheets

HEATSINK ASSEMBLY

CROSS-REFERENCE TO RELATED APPLICATIONS

This application claims all benefits accruing under 35 U.S.C. §119 from Korean Patent Application No. 2005-91196, filed on Sep. 29, 2005, in the Korean Intellectual Property Office, the disclosure of which is incorporated by reference herein.

BACKGROUND OF THE INVENTION

1. Field of the Invention

The present invention relates to a heatsink assembly for electronic components, and more particularly, to a heatsink assembly having a simple structure for coupling a heatsink and a heat source, i.e., an integrated circuit (IC) chip or an electronic package.

2. Related Art

Modern electronic appliances such as computer systems have not only microprocessor chips, but also many hundreds of integrated circuits (ICs) and other electronic components, most of which are mounted on printed circuit boards (PCBs). Many of these components generate heat during normal operation. Components that have a relatively small number of functions relative to their size, as, for example, small scale integrated circuits (ICs), usually dissipate all their heat. However, as these components become smaller and smaller to the extent that thousands are now combined into a single integrated circuit (IC) chip or an electronic package, and operate faster and faster to provide the computing power that is increasingly required, the amount of heat which the components dissipated increasingly require the assistance of external cooling devices such as heatsinks.

Heatsinks are typically passive devices that are thermally coupled to a heat source, i.e., an integrated circuit (IC) chip or an electronic package such as a microprocessor to absorb heat from the electronic components. Generally, a heatsink is mounted on a heat source to absorb and dissipate heat generated therein. Efforts have been made to increase a contact area between the heatsink and a working fluid, and process a plurality of micro-sized fluid channels in the heatsink for enhancing the cooling efficiency of the IC chip or the electronic package. As a result, aA heatsink assembly which can efficiently transfer heat generated from the electronic chip to the heatsink and prevent separation of the electronic chip and the heatsink is required.

FIG. 1 illustrates a conventional heatsink assembly, as disclosed, for example, in U.S. Pat. No. 6,466,443, for cooling a central processing unit (CPU) mounted on a substrate, via a heatsink fastener with pivotable securing means. Referring to FIG. 1, the conventional heatsink assembly includes a substrate 1 on which a CPU 10 is mounted, a heatsink 30, and a retention module 20 and a pressing frame 50 which are used for installing a cooling fan 40. The heatsink 30 is attached to a surface of the CPU 10 to absorb heat transferred from the CPU 10, and the cooling fan 40 is installed on the heatsink 30 to dissipate the heat from the heatsink 30.

The retention module 20 is coupled to the substrate 1, and the heatsink 30 is disposed on the surface of the CPU 10. The pressing frame 50 is coupled to the retention module 20 to fix the heatsink 30 and the cooling fan 40, such that the heatsink 30 is secured to the surface of the CPU 10.

As shown in FIG. 1, the heatsink assembly includes the heatsink 30 and the cooling fan 40 stacked on the surface of the CPU 10, such that heat generated by the CPU 10 and transferred to the heatsink 30 is dissipated due to forced convection caused by the cooling fan 40. Since the heat transfer efficiency depends on the intensity of contact between the CPU 10 and the heatsink 30, the CPU 10 and the heatsink 30 should be tightly secured to each other using the retention module 20 and the pressing frame 50.

However, the conventional heatsink assembly, as shown in FIG. 1, has a problem in that the retention module 20 and the pressing frame 50 are additionally required to install the cooling fan 40 on the heatsink 30, thereby increasing the number of components, manufacturing costs, and reducing the possibility of miniaturizing the heatsink assembly.

SUMMARY OF THE INVENTION

Several aspects and example embodiment of the present invention provide a new and improved heatsink assembly having a heatsink that can be secured to a heat source, i.e., an IC chip or an electronic package without additional elements.

Additional aspects and/or advantages of the invention will be set forth in part in the description which follows and, in part, will be obvious from the description, or may be learned by practice of the invention.

According to an embodiment of the present invention, there is provided a heatsink assembly comprising: a heat source mounted on a substrate; a heatsink which is arranged in contact with the heat source mounted on the substrate to absorb heat generated from the heat source; and a pressing member which is arranged to couple to the substrate so as to secure the heatsink onto the substrate, wherein the pressing member is provided with a pressing cover for pressing the heatsink so that the heatsink can be secured in contact with the heat source; and tension parts which extend from the pressing cover and exert a pressing force onto the pressing cover, when being coupled to the substrate.

According to an aspect of the present invention, the heatsink comprises: a base body having a flat bottom surface and an inner space; an inlet which is disposed on a first side wall of the base body and through which a fluid flows into the base body; an outlet which is disposed on a second side wall of the base body and through which the fluid inside the base body flows out; and a plurality of guide members which are formed in the inner space of the base body to guide the fluid introduced through the inlet via a plurality of fluid channels toward the outlet.

According to an aspect of the present invention, the pressing member further comprises: a sealing tap which is formed on a first surface of the pressing cover facing the heatsink to seal the inner space of the heatsink; and an O-ring or adhesive applied between the sealing tap and the heatsink, so as to prevent leakage of the fluid introduced into the heatsink.

According to another aspect of the present invention, a plurality of heat dissipating fins are further provided on a second surface of the pressing cover, opposite to a first surface of the pressing cover that faces the heatsink, so as to further dissipate heat from the heatsink. Additionally or alternatively, a heat dissipating fan which is installed on a second surface of the pressing cover opposite to a first surface of the pressing cover that faces the heatsink, so as to dissipate heat from the heatsink.

In accordance with another embodiment of the present invention, a heatsink assembly is provided with a circuit board to support a heat source; a heatsink arranged to dissipate heat generated from the heat source; and a pressing member coupled to the circuit board so as to secure the heatsink onto the heat source. Such a pressing member comprises a pressing cover for pressing the heatsink so that the heatsink can be secured to the heat source, and tension parts which extend from the pressing cover and exert a pressing force onto the pressing cover, when being coupled to the circuit board.

According to an aspect of the present invention, the heatsink comprises a base body having a flat bottom surface and an inner space; an inlet which is disposed on a first side wall of the base body and through which a fluid flows into the base body; an outlet which is disposed on a second side wall of the base body and through which the fluid inside the base body flows out; and a plurality of guide members which are formed in the inner space of the base body and projected upwardly from the base body so as to guide the fluid introduced through the inlet, via a plurality of fluid channels toward the outlet.

According to an aspect of the present invention, the pressing member further comprises: a sealing tap which is formed on a first surface of the pressing cover facing the heatsink to seal the inner space of the heatsink; and an O-ring or adhesive applied between the sealing tap and the heatsink, so as to prevent leakage of the fluid introduced into the heatsink.

In addition to the example embodiments and aspects as described above, further aspects and embodiments of the present invention will be apparent by reference to the drawings and by study of the following descriptions.

BRIEF DESCRIPTION OF THE DRAWINGS

A better understanding of the present invention will become apparent from the following detailed description of example embodiments and the claims when read in connection with the accompanying drawings, all forming a part of the disclosure of this invention. While the following written and illustrated disclosure focuses on disclosing example embodiments of the invention, it should be clearly understood that the same is by way of illustration and example only and that the invention is not limited thereto. The spirit and scope of the present invention are limited only by the terms of the appended claims. The following represents brief descriptions of the drawings, wherein:

DETAILED DESCRIPTION OF THE EMBODIMENTS

Figure 1:
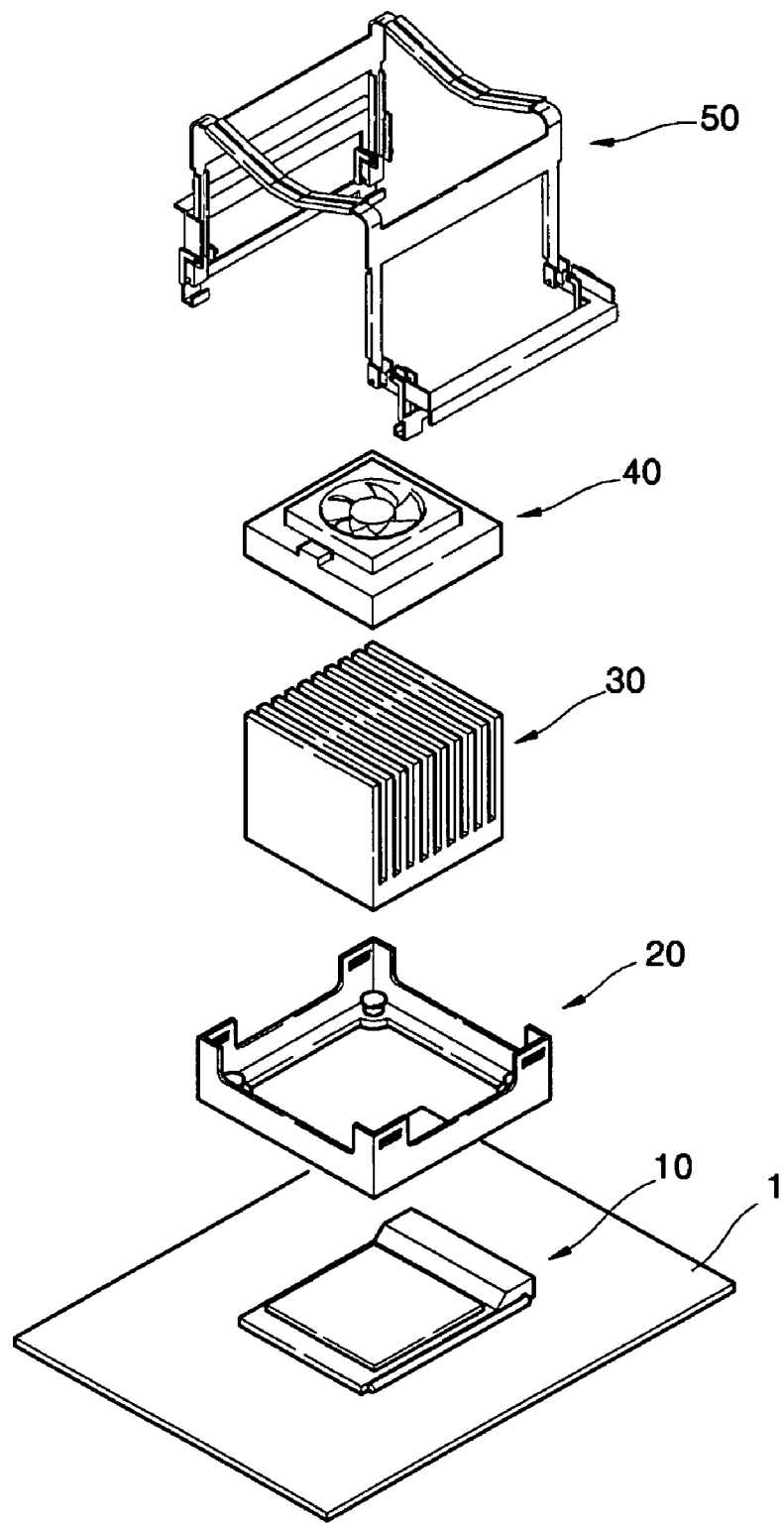
FIG. 1 is an exploded perspective view of a typical heatsink assembly.

The present invention is applicable for use with all types of electronic packages and IC devices, including new microprocessor chips which may become available as computer technology develops in the future. Further, the present invention is not limited to use in computer systems, but is suitable for applications in many industries and/or environments. However, for the sake of simplicity, discussions will concentrate mainly on exemplary use of a heatsink assembly to be mounted onto a system board of a computer system, although the scope of the present invention is not limited thereto. Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
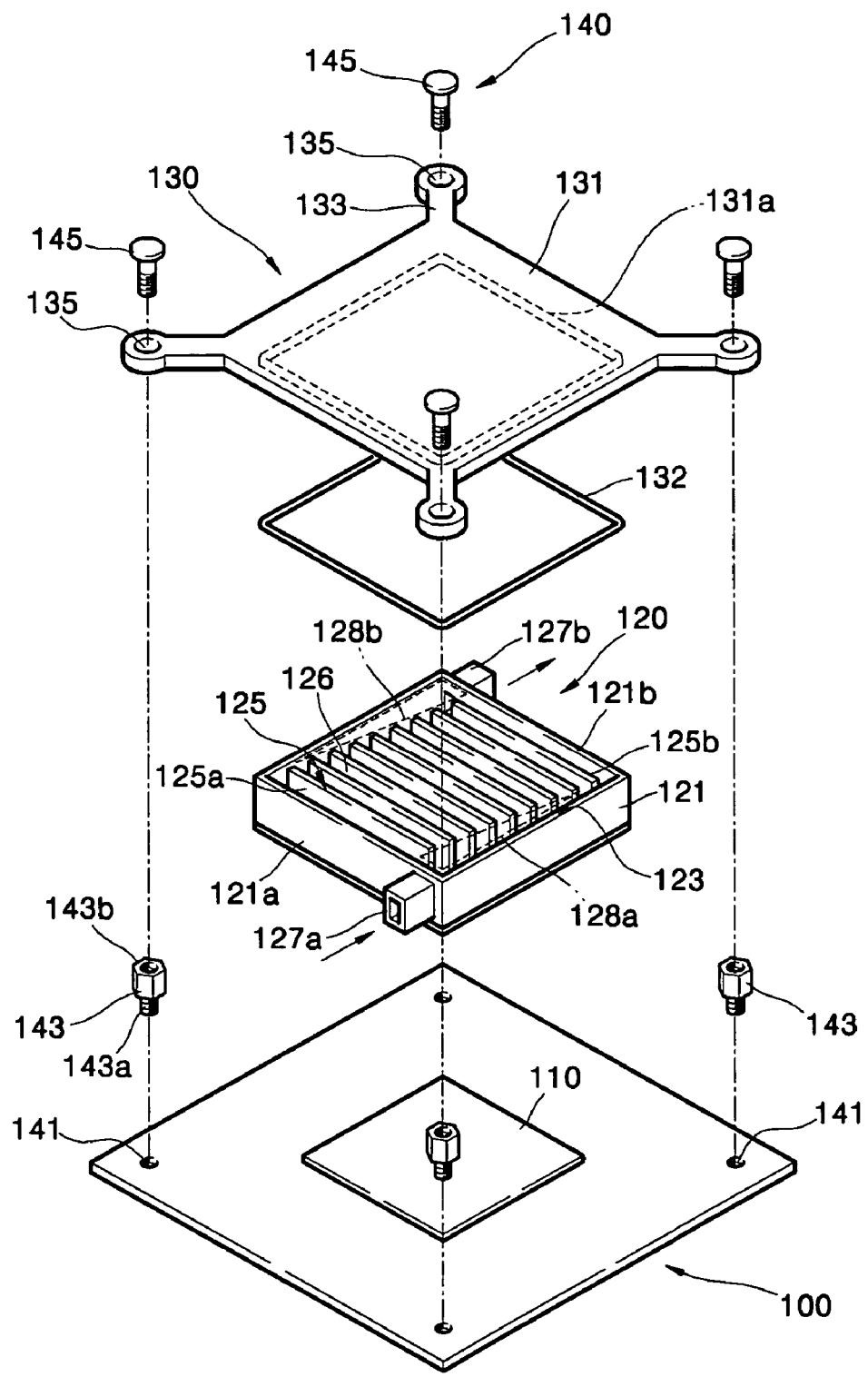
FIG. 2 is an exploded perspective view of an example heatsink assembly according to an embodiment of the present invention.
Figure 3:
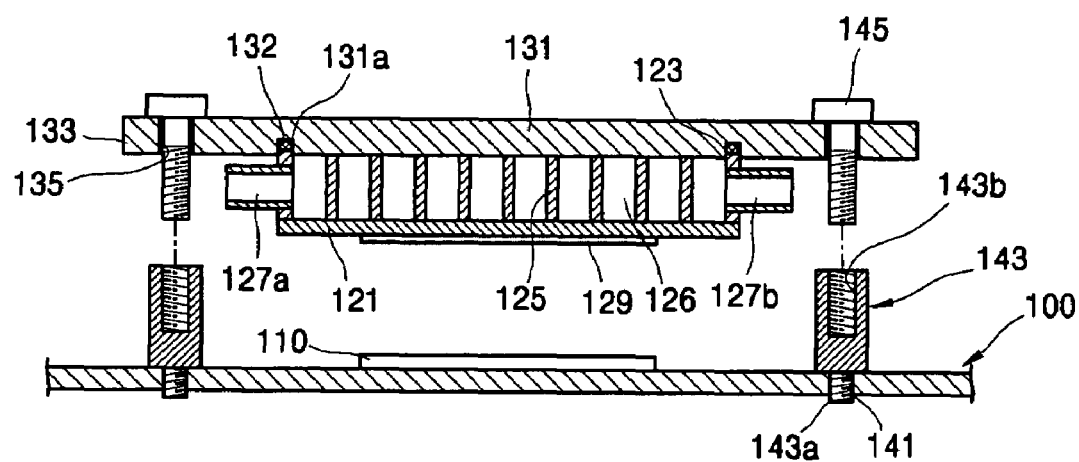
FIG. 3 is a cross-sectional view of the heatsink assembly shown in FIG. 2.

FIG. 2 is an exploded perspective view of an example heatsink assembly according to an embodiment of the present invention. FIG. 3 is a cross-sectional view of the heatsink assembly shown in FIG. 2.

Referring to FIGS. 2 and 3, the heatsink assembly includes a heatsink 120 arranged in contact with a heat source 110, i.e., an IC chip or an electronic package, mounted on a substrate 100 and absorbs heat generated from the heat source 110, and a pressing member 130 that is coupled to the substrate 100 and presses the heatsink 120 so that the heatsink 120 can be tightly secured to the heat source 110.

The heat source 110 can be any heat producing component such as an integrated circuit (IC) chip, or an electronic package such as a central processing unit (CPU), or a digital signal processing unit (DSP).

The heatsink 120 cools the heat source 110 through the heat exchange between the heatsink 120 and the heat source 110. The heatsink 120 is installed in a pipe or duct structure through which a fluid can enter from an external pump or tank. The heatsink 120 is made of a high heat conductive material, for example, silicon, pure copper, brass, duralumin, or aluminum. The fluid may be air, liquid nitrogen, water, fluorocarbon, or the like, which can absorb and carry heat.

The heatsink 120 includes a base body 121 having a flat bottom surface, and an inner space, an inlet 127a through which the fluid flows into the base body 121, an outlet 127b through which the fluid inside the body 121 flows out, and a plurality of guide members 125 formed in the inner space of the base body 121 and extending perpendicularly or projecting upwardly from the heat spreader base body 121. The heat spreader base body 121 may generally be a rectangular plate and its size may be co-extensive with the size of the heat source 110.

The pressing member 130 is downwardly attached to the base body 122 to seal the inner space of the base body 121. Accordingly, except the inlet 127a and the outlet 127b, the inner space of the base body 121 is hermetically sealed. The inlet 127a is formed on a first side wall 121a of the base body 121. The outlet 127b is formed on a second side wall 121b of the base body 121 facing the first side wall 121a. In particular, the inlet 127a and the outlet 127b respectively formed on the first and second side walls 121a and 121b are diagonal to each other.

The plurality of guide members 125 are spaced at predetermined intervals from one another to define a plurality of fluid channels 126 in the inner space of the base body 121. The guide members 125 are arranged to prevent the fluid introduced through the inlet 127a from directly flowing toward the outlet 127b. The guide members 125 may be arranged in parallel to the first and second side walls 121a and 121b.

An inflow guide part 128a through which the fluid enters is formed on a first side of the guide members 125, that is, on the side of the inlet 127a, and an outflow guide part 128b through which the fluid exits is formed on a second side of the guide members 125 opposite to the first side, that is, on the side of the outlet 127b. Each of the inflow guide part 128a and the outflow guide part 128b is an empty space where the guide members 125 are not formed. The size of each of the inflow guide part 128a and the outflow guide part 128b is determined by the arrangement of the plurality of guide members 125.

The inflow guide part 128a is narrower from a first guide member 125a closer to the inlet 127a to a second guide member farther from the inlet 127a. The outflow guide part 128b is broader from the first guide member 125a to the second guide member 125b.

The fluid entering through the inlet 127a into the inflow guide part 128a diverges through the tapering inflow guide part 128a to the fluid channels 126 formed between the plurality of guide members 125, and then exits through the outflow guide part 128b to the outlet 127b. Accordingly, the fluid can be uniformly supplied at a constant speed to the respective fluid channels 126, thereby enhancing cooling efficiency.

The pressing member 130 is coupled to the substrate 100, and includes a pressing cover 131 and tension parts 133 that exert a pressing force onto the pressing cover 131.

A bottom surface of the pressing cover 131 is brought in contact with the heatsink 120 to press the heatsink 120, such that the heatsink 120 can be secured to the heat source 110. Then, in order to prevent damages or breaking of the heat source 110, a pad 129, as shown in FIG. 3, may be inserted between the heatsink 120 and the heat source 110. A sealing tap 131a may be formed on the bottom surface of the pressing cover 131 facing the heatsink 120 to seal the inner space of the heatsink 120. An O-ring 132 may be inserted between the sealing tap 131a and the heatsink 120. As a result, the fluid can be prevented from leaking between the pressing cover 131 and an upper end 123 of a sidewall of the heatsink 120. Instead of the O-ring 132, an adhesive (not shown) may be applied between the sealing tap 131a and the heatsink 120.

The tension parts 133 extend from the pressing cover 131, and exert a pressing force onto the pressing cover 131, when being fastened to the substrate 100 using fastening members 140 such that the pressing cover 131 is secured to the heatsink 120.

The fastening members 140 fasten the tension parts 133 to the substrate 100. The fastening members 140 include first screw holes 141 formed in the substrate 100, fastening holes 135 formed in ends of the tension parts 133, and first and second screws 143 and 145. Each of the first screws 143 includes a bolt 143a screwed into the first screw 143, and a second screw hole 143b. The second screws 145 are screwed into the second screw holes 143b after passing through the fastening holes 135. The structure of the fastening members 140 is explained only by way of example, and can be modified in various ways. That is, the pressing member 130 may be coupled to the substrate 100 by forming insertion holes, instead of the first screw holes 141, in the substrate 100 and employing bolts and nuts, or may be coupled using hooks or fastening pins and the like.

Figure 4:
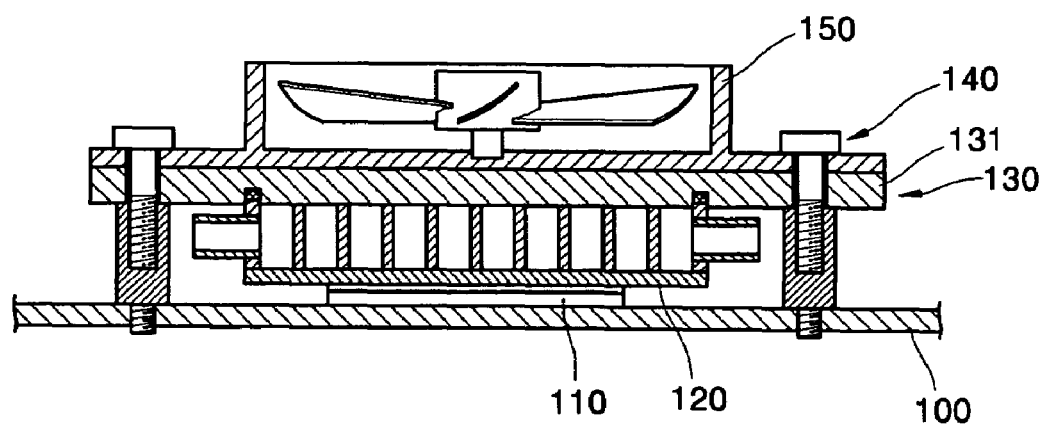
FIG. 4 is a cross-sectional view of an example heatsink assembly according to another embodiment of the present invention.
Figure 5:
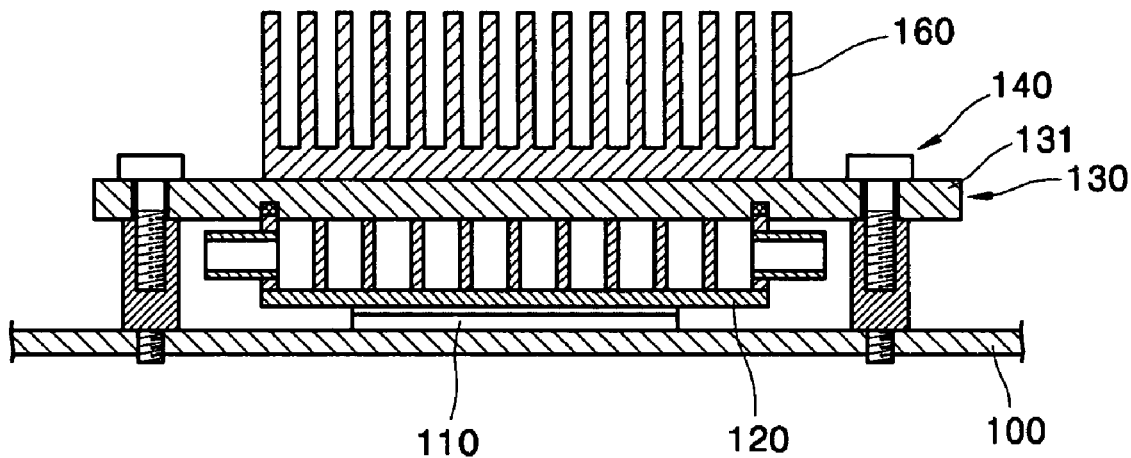
FIG. 5 is a cross-sectional view of an example heatsink assembly according to still another embodiment of the present invention.

A heat dissipating fan 150 may be installed on the pressing cover 131, as shown in FIG. 4. Referring to FIG. 4, the heat dissipating fan 150 is installed on a top surface of the pressing cover 131 opposite to the bottom surface facing the heatsink 120 to dissipate heat.

in addition, or alternatively, a plurality of heat dissipating fins 160 may be installed on the pressing cover 131, as shown in FIG. 5. The heat dissipating fins 160 promote the heatsink 120 to dissipate heat quicker, thereby enhancing the cooling efficiency.

As described above, the heatsink assembly according to example embodiments of the present invention can advantageously secure a heatsink to a heat source without an additional element, such as a retention module used by a conventional heatsink assembly. Accordingly, the heatsink assembly according to example embodiments of the present invention can be made compact, and has a reduced number of components and manufacturing costs.

While there have been illustrated and described what are considered to be exemplary embodiments of the present invention, it will be understood by those skilled in the art and as technology develops that various changes and modifications may be made, and equivalents may be substituted for elements thereof without departing from the true scope of the present invention. For example, the heatsink may be available in a variety of size and shapes with different guide member and channel arrangements and projections. The overall dimensions of the heatsink may also be designed depending upon the electrical elements used, the desired strength, the structural rigidity, and the thermal stability. For example, the heatsink may be constructed of any metallic material that is light weight and has a high level of thermal conductivity, such as a copper-tungsten alloy, aluminum nitride, beryllium oxide or oxide. More importantly, a wide variety of different guide member configurations may be used in substitution of those described with reference to FIGS. 2, 3, and 4. In addition, those guide members (also known as "fins") may be machined or constructed from a single metallic conduction base material forming the main body. Separately, the guide members (also known as "fins") may also be attached to or mounted onto (by way of solder, adhesive, or other low thermal resistance material) the heat spreader base of the same or different high thermal conduction material. Furthermore, different sizes and shapes of the guide members and channels may be alternatively used. Many modifications may be made to adapt the teachings of the present invention to a particular situation without departing from the scope thereof. Therefore, it is intended that the present invention not be limited to the various exemplary embodiments disclosed, but that the present invention includes all embodiments falling within the scope of the appended claims.

What is claimed is:

1. A heatsink assembly comprising:
   a heat source mounted on a substrate;
   a heatsink arranged in contact with the heat source mounted on the substrate to dissipate heat generated from the heat source; and
   a pressing member arranged to couple to the substrate so as to secure the heatsink onto the substrate,
   wherein the pressing member comprises:
     a pressing cover for pressing the heatsink so that the heatsink can be secured in contact with the heat source; and
     tension parts which extend from the pressing cover and exert a pressing force onto the pressing cover, when being coupled to the substrate, and
   wherein the heatsink comprises:
     a base body having a flat bottom surface and an inner space;
     an inlet which is disposed on a first side wall of the base body and through which a fluid flows into the base body;

an outlet which is disposed on a second side wall of the base body and through which the fluid inside the base body flows out; and a plurality of guide members which are formed in the inner space of the base body to guide the fluid introduced through the inlet via a plurality of fluid channels toward the outlet.

2. The heatsink assembly as claimed in claim 1, wherein the pressing member further comprises:

a sealing tap which is formed on a first surface of the pressing cover facing the heatsink to seal the inner space of the heatsink; and an O-ring or adhesive applied between the sealing tap and the heatsink, so as to prevent leakage of the fluid introduced into the heatsink.

3. The heatsink assembly as claimed in claim 1, further comprising a plurality of heat dissipating fins formed on a second surface of the pressing cover, opposite to a first surface of the pressing cover that faces the heatsink, so as to dissipate heat from the heatsink.

4. The heatsink assembly as claimed in claim 1, further comprising a heat dissipating fan which is installed on a second surface of the pressing cover opposite to a first surface of the pressing cover that faces the heatsink, so as to dissipate heat from the heatsink.

5. A heatsink assembly comprising:

a circuit board to support a heat source;

a heatsink arranged to dissipate heat generated from the heat source; and a pressing member coupled to the circuit board so as to secure the heatsink onto the heat source, the pressing member comprising a pressing cover for pressing the heatsink so that the heatsink can be secured to the heat source, and tension parts which extend from the pressing cover and exert a pressing force onto the pressing cover, when being coupled to the circuit board, wherein the heatsink comprises:

a base body having a flat bottom surface and an inner space;

an inlet which is disposed on a first side wall of the base body and through which a fluid flows into the base body;

an outlet which is disposed on a second side wall of the base body and through which the fluid inside the base body flows out; and a plurality of guide members which are formed in the inner space of the base body and projected upwardly from the base body so as to guide the fluid introduced through the inlet, via a plurality of fluid channels toward the outlet.

6. The heatsink assembly as claimed in claim 5, wherein the pressing member further comprises:

a sealing tap which is formed on a first surface of the pressing cover facing the heatsink to seal the inner space of the heatsink; and an O-ring or adhesive applied between the sealing tap and the heatsink, so as to prevent leakage of the fluid introduced into the heatsink.

7. The heatsink assembly as claimed in claim 5, further comprising a plurality of heat dissipating fins formed on a second surface of the pressing cover, opposite to a first surface of the pressing cover that faces the heatsink, so as to dissipate heat from the heatsink.

8. The heatsink assembly as claimed in claim 5, further comprising a heat dissipating fan which is installed on a second surface of the pressing cover opposite to a first surface of the pressing cover that faces the heatsink, so as to dissipate heat from the heatsink.

9. A heatsink assembly comprising:

a CPU;

a PCB supporting the CPU mounted thereon;

a heatsink attached to the CPU to dissipate heat generated from the CPU; and a pressing member arranged to couple to the PCB so as to secure the heatsink onto the PCB, wherein the pressing member comprises a pressing cover for pressing the heatsink so that the heatsink can be secured in contact with the CPU; and tension parts which extend from the pressing cover and exert a pressing force onto the pressing cover, when being coupled to the PCB, wherein the heatsink comprises:

a base body having a flat bottom surface and an inner space;

an inlet which is disposed on a first side wall of the base body and through which a fluid flows into the base body;

an outlet which is disposed on a second side wall of the base body and through which the fluid inside the base body flows out; and a plurality of guide members which are formed in the inner space of the base body and projected upwardly from the base body so as to guide the fluid introduced through the inlet, via a plurality of fluid channels toward the outlet.

10. The heatsink assembly as claimed in claim 9, wherein the pressing member further comprises:

a sealing tap which is formed on a first surface of the pressing cover facing the heatsink to seal the inner space of the heatsink; and an O-ring or adhesive applied between the sealing tap and the heatsink, so as to prevent leakage of the fluid introduced into the heatsink.

11. The heatsink assembly as claimed in claim 9, further comprising a plurality of heat dissipating fins formed on a second surface of the pressing cover, opposite to a first surface of the pressing cover that faces the heatsink, so as to dissipate heat from the heatsink.

12. The heatsink assembly as claimed in claim 9, further comprising a heat dissipating fan which is installed on a second surface of the pressing cover opposite to a first surface of the pressing cover that faces the heatsink, so as to dissipate heat from the heatsink.

* * * * *